(12) United States Patent
Yang et al.

(10) Patent No.: US 9,460,999 B2
(45) Date of Patent: Oct. 4, 2016

(54) SOLUTION PROCESS FOR IMPROVED NANOWIRE ELECTRODES AND DEVICES THAT USE THE ELECTRODES

(75) Inventors: Yang Yang, Los Angeles, CA (US); Rui Zhu, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 77 days.

(21) Appl. No.: 14/344,038

(22) PCT Filed: Sep. 13, 2012

(86) PCT No.: PCT/US2012/055214
§ 371 (c)(1),
(2), (4) Date: Mar. 10, 2014

(87) PCT Pub. No.: WO2013/040245
PCT Pub. Date: Mar. 21, 2013

(65) Prior Publication Data
US 2014/0225260 A1     Aug. 14, 2014

Related U.S. Application Data

(60) Provisional application No. 61/534,093, filed on Sep. 13, 2011.

(51) Int. Cl.
*H01L 23/532*     (2006.01)
*B82Y 30/00*     (2011.01)
(Continued)

(52) U.S. Cl.
CPC .......... *H01L 23/5328* (2013.01); *B82Y 20/00* (2013.01); *B82Y 30/00* (2013.01);
(Continued)

(58) Field of Classification Search
CPC ................. H05K 2201/026; H01L 21/2603; H01L 29/413; H01L 2221/1094; H01L 23/5328; H01L 21/288; B82Y 20/00; B82Y 30/00; H01B 1/16
See application file for complete search history.

(56) References Cited

U.S. PATENT DOCUMENTS

2006/0021647 A1*   2/2006   Gui et al. .................... 136/252
2008/0041447 A1*   2/2008   Tseng .................. H01L 51/4226
                                                                 136/263

(Continued)

FOREIGN PATENT DOCUMENTS

WO    WO 2007-061945 A2   5/2007
WO    WO 2007061945 A2 *   5/2007   .......... H01M 8/1002

OTHER PUBLICATIONS

Int'l Search Report and Written Opinion of PCT/US2012/055214.

*Primary Examiner* — Allen Parker
*Assistant Examiner* — Gustavo Ramallo
(74) *Attorney, Agent, or Firm* — Venable LLP; Henry J. Daley; Laura G. Remus

(57) ABSTRACT

A method of producing an electro-optic device includes providing a substructure, depositing a network of nanowires on the substructure, depositing a sol-gel solution on the network of nanowires and the substructure, and removing solvent from the sol-gel solution to provide fusing material that causes junctions of nanowires within the network of nanowires to fuse together to reduce electrical sheet resistance of the network of nanowires. An electro-optic device includes a sub-structure, a network of nanowires deposited on the substructure, and a plurality of nanoparticles attached to the network of nanowires. The plurality of nanoparticles fuse junctions of overlapping nanowires together to reduce electrical sheet resistance of the network of nanowires.

25 Claims, 7 Drawing Sheets

(51) Int. Cl.
*B82Y 20/00* (2011.01)
*H01L 51/44* (2006.01)
*H01B 1/16* (2006.01)
*H01L 21/288* (2006.01)
*H01L 51/00* (2006.01)

(52) U.S. Cl.
CPC ............ *H01B 1/16* (2013.01); *H01L 21/288* (2013.01); *H01L 23/53209* (2013.01); *H01L 51/442* (2013.01); *H01L 51/0037* (2013.01); *H01L 2924/0002* (2013.01); *Y02E 10/549* (2013.01)

(56) References Cited

U.S. PATENT DOCUMENTS

| | | | |
|---|---|---|---|
| 2009/0116277 A1* | 5/2009 | Tran | 365/151 |
| 2010/0003781 A1* | 1/2010 | Van Duren et al. | 438/98 |
| 2010/0266897 A1* | 10/2010 | Lee et al. | 429/219 |
| 2012/0127097 A1* | 5/2012 | Gaynor | B82Y 20/00 345/173 |

* cited by examiner

SOLUTION PROCESS FOR IMPROVED NANOWIRE ELECTRODES AND DEVICES THAT USE THE ELECTRODES

CROSS-REFERENCE OF RELATED APPLICATION

This is a national stage application under 35 U.S.C. §371 of PCT/US2012/055214 filed Sep. 13, 2012, the entire contents of which are incorporated herein b reference and this application claims priority to U.S. Provisional Application No. 61/534,093 filed Sep. 13, 2011, the entire contents of which are hereby incorporated by reference.

BACKGROUND

1. Field of Invention

The field of the currently claimed embodiments of this invention relates to solution processes for producing electrodes for electro-optic devices and devices that use the electrodes.

2. Discussion of Related Art

The most dominant transparent conductive film currently in use for electro-optic devices, such as liquid crystal displays, touch-screen displays and photovoltaic cells, for example, is Indium-Tin-Oxide (ITO). High transparency and low sheet resistant have ensured its wide application in many areas. Although it has been used for several decades, there is significant interest in developing alternatives to ITO because of the decreasing availability, and accompanying increase in price, of indium. Due to the high and increasing demand for transparent electrodes, and the limited supply of indium, there is currently an urgent need for new transparent electrodes.

There are several candidates for transparent electrodes based on materials that can potentially replace ITO. These include the use of carbon nanotubes (CNT), graphene, or thin metal films, for example. However, these candidates all have disadvantages that they compromise between optical transparency and electrical conductivity.

Recently, some efforts have been directed to using silver nanowire (AgNW) networks to form transparent conductors. There are several issues that remain to be addressed for the large scale fabrication of AgNW films. First, a good electrical connection between crossed AgNWs is a key factor to achieve high conductivity. However, due to surfactant coating of PVP on the surface of AgNW, extra processes are often utilized to fuse the crossed AgNWs together. These processes include high temperature thermal annealing (>150 ° C.), applying extra pressure or vacuum filtering on anodized aluminum oxide (AAO) membrane substrates and HCl vapor treatment, etc. Second, strong adhesion between AgNW and substrates is necessary to obtain stable and robust AgNW fibrous films. Substrate surface modification has been used to improve the adhesion of AgNWs on the substrate. Burying AgNW into polymer films by applying pressure can also provide strong adhesion between AgNWs and substrates. Moreover, nail polish or in-situ polymerization has also been reported to improve the adhesion. However, these efforts have not provided transparent electrodes and methods of production that are adequate to replace ITO. Therefore, there remains a need for improved transparent electrodes, methods of producing the electrodes, and devices that use the electrodes.

SUMMARY

A method of producing an electro-optic device according to an embodiment of the current invention includes providing a substructure, depositing a network of nanowires on the substructure, depositing a sol-gel solution on the network of nanowires and the substructure, and removing solvent from the sol-gel solution to provide fusing material that causes junctions of nanowires within the network of nanowires to fuse together to reduce electrical sheet resistance of the network of nanowires.

An electro-optic device according to an embodiment of the current invention includes a substructure, a network of nanowires deposited on the substructure, and a plurality of nanoparticles attached to the network of nanowires. The plurality of nanoparticles fuse junctions of overlapping nanowires together to reduce electrical sheet resistance of the network of nanowires.

BRIEF DESCRIPTION OF THE DRAWINGS

Further objectives and advantages will become apparent from a consideration of the description, drawings, and examples.

DETAILED DESCRIPTION

Figure 1:
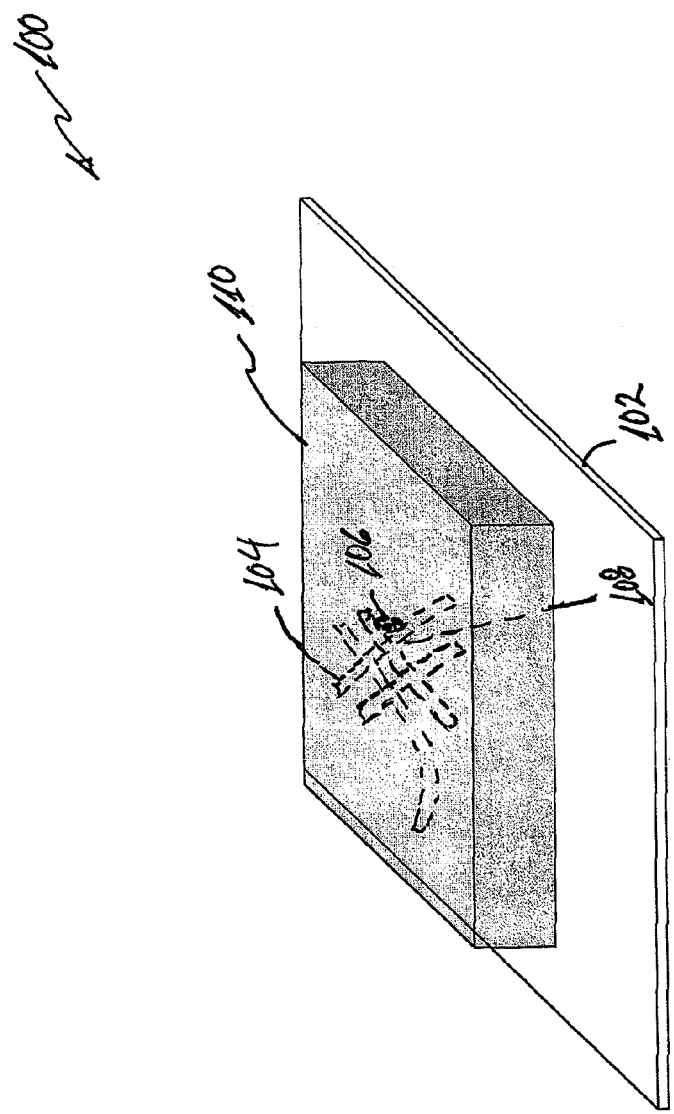
FIG. 1 is a schematic illustration of an electro-optic device according to an embodiment of the current invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Accordingly, some embodiments of the current invention are directed to a method of producing an electro-optic device that includes providing a substructure, depositing a network of nanowires on the substructure, depositing a sol-gel solution on the network of nanowires and the substructure, and removing solvent from the sol-gel solution to provide fusing material that causes junctions of nanowires within the network of nanowires to fuse together to reduce electrical sheet resistance of the network of nanowires.

The electro-optic device can be basically a transparent electrode on a substrate or any of a wide range of devices such as, but not limited to, a photovoltaic cell, a light-emitting diode, a photodiode, a transistor, a display screen or a touch-sensitive display screen. The substrate can be a rigid substrate or a flexible substrate, depending on the application. For example, the substrate can be, but is not limited to, a glass substrate, a plastic substrate, a paper substrate, a semiconductor substrate, or a metal substrate.

The term "network of nanowires" is intended to refer to an arrangement of a plurality of nanowires such that there are multiple overlapping junctions between different nanowires. The nanowires within the network can be randomly or semi-randomly arranged, and can have a distribution of lengths, i.e., they do not have to be uniformly the same length. The network can be thought as being similar to a fabric, although not woven or tied together in a systematic manner. As an electrode, the plurality of nanowires in the network provide multiple electrical pathways from one edge of the network to the other such that breaking a relatively small number of junctions will still leave alternative electrical paths from one edge of the network to the other. The network of nanowires can thus be flexible as well as fault tolerant, somewhat analogous to a communications network, such as the interne.

The term "nanowire" is intended to include any electrically conducting structure that has cross dimensions less than about 200 nm and a longitudinal dimension that is at least ten times greater than the largest cross dimension. In some cases, the longitudinal dimension can be one hundred times greater than the largest cross dimension, one thousand times greater than the largest cross dimension, or even more.

The network of nanowires can include Ag nanowires, carbon nanotubes, Si nanowires, ZnO nanowires, $TiO_2$ nanowires, $SnO_2$ nanowires, $V_2O_5$ nanowires, Cu nanowires, and/or Cu alloy nanowires, for example. Copper alloy nanowires can include, but are not limited to, Cu—Ni alloy nanowires. The nanowires can be conventionally produced and obtain from commercial sources, or could be specially produced for the particular application. The nanowires can be deposited by spray coating, dip coating, spin coating or any other suitable process, depending on the application.

The step of depositing a sol-gel solution on the network of nanowires and the substructure can use any of the available methods of depositing a sol-gel solution, for example. The term "sol-gel solution" is intended to include colloidal suspensions as well as solutions in which the solute is dissolved in a solvent. For example, the sol-gel solution can be applied by, but is not limited to, spray coating, dip coating, spin coating, etc.

The step of removing solvent from the sol-gel solution can include hastening evaporation of a volatile solvent, such as, but not limited to, increasing temperature over the ambient temperature and/or increasing ventilation or air or gas circulation over the deposited sol-gel solution. Centrifugation can also be used instead or in addition to the above-noted examples. The removal of the solvent from the sol-gel solution provides fusing material that causes junctions of nanowires within the network of nanowires to fuse together to reduce electrical sheet resistance of the network of nanowires. For example, as the solvent is removed, clusters of nanoparticles form at the junctions of nanowires within the network of nanowires. The term "nanoparticle" is intended to include any shape that has all outer dimensions less than about 200 nm. The clusters of nanoparticles provide compressive forces to the nanowires as the solvent evaporates, for example, causing the nanowires to fuse at the junctions. This can overcome coatings of surfactants and impurities, for example, to effectively nano-scale clamps at the junctions of the nanowires. In some embodiments, the clusters of nanoparticles can include at least one of $TiO_2$, $Fe_3O_4$, ZnO, $Zr_2O_5$, $Co_3O_4$, NiO, $MoO_3$, ITO, Al-doped ZnO, MgO, and $Al_2O_3$.

The method of producing an electro-optic device according to some embodiments of the current invention can further include, subsequent to the step of removing solvent from the sol-gel solution, forming a binding layer of a binding material on the network of nanowires, the fusing material and the substructure such that the binding material encapsulates the network of nanowires and the fusing material on the substructure. For example, in some embodiments, the binding layer can provide mechanical support and integrity to the network of nanowires and attached clusters of nanoparticles, as well as help attach the composite structure to the substructure. In some embodiments, the step of forming the binding layer of the binding material can be, or include, depositing a second sol-gel solution on the network of nanowires, the fusing material and the substructure. In some embodiments, the method of producing an electro-optic device can further include removing solvent from the second sol-gel solution such that the binding material encapsulates the network of nanowires and the fusing material. In some embodiments, the steps of removing solvent from the first sol-gel solution and the removing solvent from the second sol-gel solution can both include increasing the temperature over an ambient temperature. In some embodiments, such a temperature processing can be a relatively low temperature process. The term "relatively low" means that it is sufficiently low to avoid damaging the substructure. For example, plastic of paper substrates may not tolerate temperatures raised above 85° C. or 80° C. However, the broad concepts of the current invention are not limited to particularly temperatures or even to including a temperature processing step.

In some embodiments, the second sol-gel solution can provide an electrically conductive and substantially transparent polymer layer. In some embodiments, the second sol-gel solution can include at least one of poly(3,4-ethylenedioxythiophene)/poly(styrenesulfonate), polyvinylpyrrolidone, polyvinyl acetate, polyvinylphenol, polyvinylpyridine, poly(oxyethylene) and a polyimide.

Some embodiments of the current invention are directed to electro-optic devices produced according to any of the above-noted methods.

FIG. 1 is a schematic illustration of an electro-optic device 100 according to another embodiment of the current invention. The electro-optic device 100 includes a substructure 102, a network of nanowires 104 deposited on the substructure 102, and a plurality of nanoparticles 106 attached to the network of nanowires 104. FIG. 1 only illustrates a few nanowires 104 and a few of the plurality of nanoparticles 106, as an example. The plurality of nanoparticles fuse junctions of overlapping nanowires, such as junction 108, together to reduce electrical sheet resistance of the network of nanowires. The electro-optic device 100 can be produced by the methods described above, for example. Similarly, the various materials described above for some embodiments can also be used in some embodiments of the electro-optic device 100.

In some embodiments, the electro-optic device 100 can further include a layer of a binding material 110 on the network of nanowires 104 and on the plurality of nanoparticles 106, and also on the substructure 102 such that the binding material 110 encapsulates the network of nanowires 104 and the plurality of nanoparticles 106 on the substructure 102. The description of the substructure and binding material with respect to the methods of production above can also apply to embodiments of the electro-optic device 100. The electro-optic device 100 can be, but is not limited to, an encapsulated transparent electrode on a substrate, a photovoltaic cell, a light-emitting diode, a photodiode, a transistor, a display screen or a touch-sensitive display screen.

EXAMPLES

The following examples help explain some concepts of the current invention. However, the general concepts of the current invention are not limited to the particular examples.

From the commercialization point of view, the fabrication process should be as simple as possible, while the performance should be equal to, or better than, conventional devices. In the following examples, we demonstrate a simple and efficacious solution-based method to achieve a highly conductive AgNW film with good transparency and excellent adhesion on the substrate. We visualize the concept as being analogous to the principle of reinforced concrete in construction. As is well known, reinforced concrete is widely used in the construction of buildings. Concrete is strong in compression, but weak in tension. By incorporating reinforcement, the strength in tension is greatly enhanced. Based on this simple concept, we use both titanium dioxide ($TiO_2$) sol-gel solution and poly(3,4-ethylenedioxythiophene)/poly(styrenesulfonate) (PEDOT:PSS) solution to treat AgNW film in the following examples. However, the general concepts of the current invention are not limited to these particular examples. AgNWs are the reinforced grids. $TiO_2$ and PEDOT:PSS are used to bind the transparent AgNW network together and hence provide improved mechanical properties. With this idea, we have achieved AgNW-$TiO_2$-PEDOT:PSS hybrid films with excellent electrical, mechanical and optical performance.

The AgNWs used here are commercially available. The AgNW film can be coated from an iso-propanol dispersion using various coating methods, such as the mayer rod coating, bar-coating, spincoating, spray coating, dip coating, etc. The AgNW network is then treated with diluted $TiO_2$ sol-gel solution (0.1% in ethanol). $TiO_2$ sol-gel solution is prepared according to our previous work. One of the most important advantages in this example is that $TiO_2$ sol-gel solution will be converted into $TiO_2$ nanoparticle clusters after low temperature hydration in air (~80° C.). $TiO_2$ is also a stable material under either acid or basic condition. This will ensure its wide application and great stability on different substrates or substructures, such as PET substrates, paper, etc. During the drying of $TiO_2$ solution around AgNWs, evaporation-induced capillarity force not only improves the fusion between crossed AgNWs, but also enhances the adhesion of AgNW on the substrate. After $TiO_2$ sol-gel solution treatment, PEDOT:PSS solution is then coated onto the AgNW-$TiO_2$ film and dried at 80° C. for 10 seconds. The PEDOT:PSS coating further fuses the connection between AgNW, resulting in decreased resistance. Meanwhile, the PEDOT:PSS layer also acts as a protective layer to enhance the adhesion between AgNW and substrate, providing a robust transparent conductive AgNW hybrid film.

Figure 2:
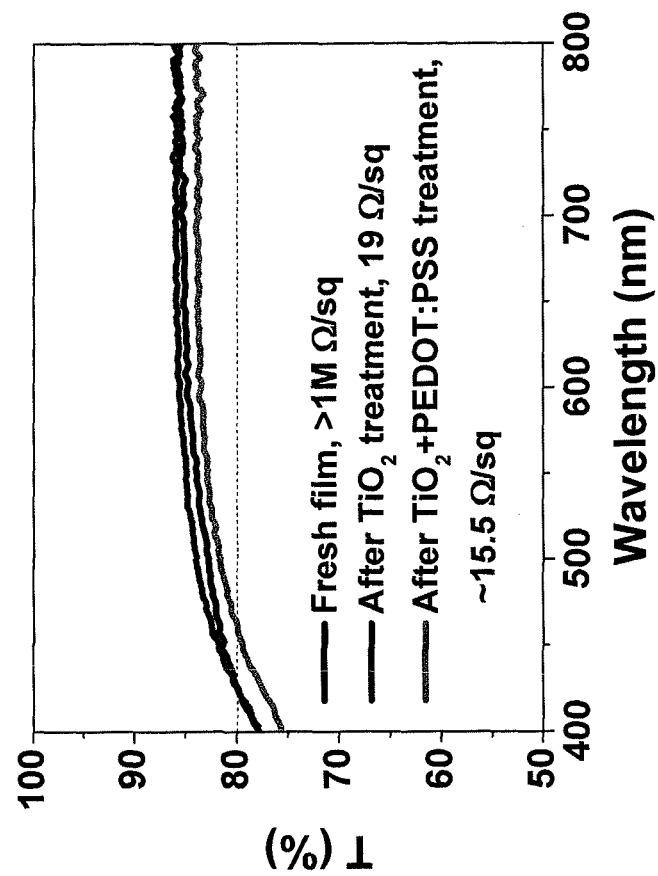
FIG. 2 shows transmission spectra of AgNW films after different treatments.

FIG. 2 shows the transmission spectrum of the AgNW film before and after different treatment. For the as-deposited Ag NW film (without any treatment), the film transparency is 84% at 550 nm. Due to possible PVP surfactant on the surface of AgNW and the loose contact between AgNWs in the fresh film, the sheet resistant is huge (>1 M$\Omega$/sq). After $TiO_2$ sol-gel treatment, the film transparency is almost the same as that before treatment, while the sheet resistant is greatly reduced from >1M $\Omega$/sq to ~19 ohm/sq. After further treatment by PEDOT:PSS solution, the film transparency is slightly decreased to 83% at 550 nm, while the sheet resistance is further decreased to 15 ohm/sq. The decreased transparency is primarily because of the absorption of PEDOT:PSS in the visible range of the electromagnetic spectrum. Such results of both transparency and resistance are comparable to some reported results for transparent AgNW films and commercial ITO substrates. The current solution treatments are much simpler and more suitable for low cost large-scale fabrication of high performance AgNW films than conventional approaches.

Figures 3A, 3B, 3C, 3D, 3E, 3F:
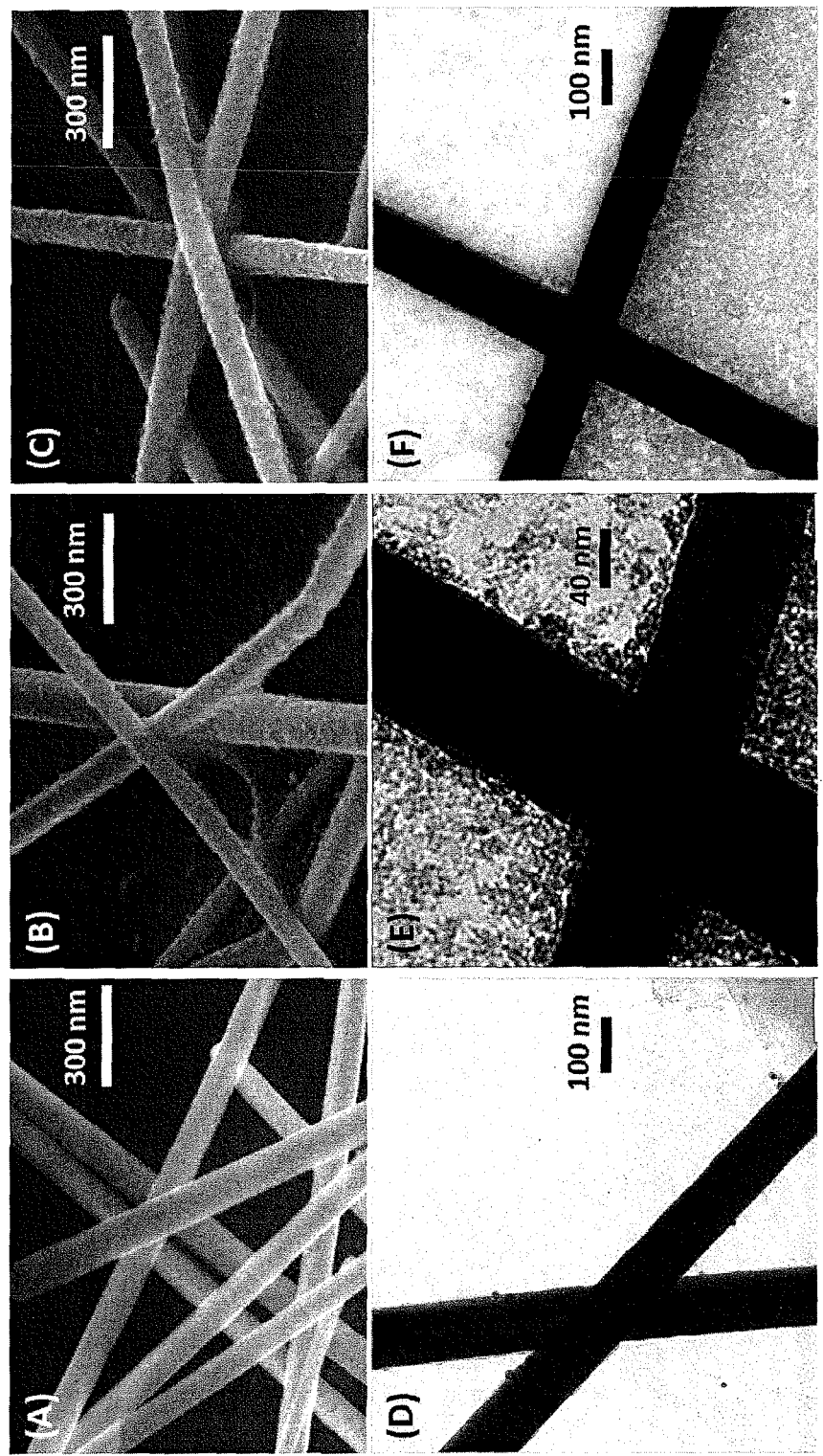
FIGS. 3A-3F show SEM (A~C) and TEM (D~F) images of the AgNW films before and after treatments. (A and D) pristine AgNWs without any treatment; (B and E) AgNWs after $TiO_2$ treatments; (C and F) AgNW-$TiO_2$-PEDOT:PSS hybrid film after with PEDOT:PSS solution treatment.
Figures 4A, 4B, 4C:
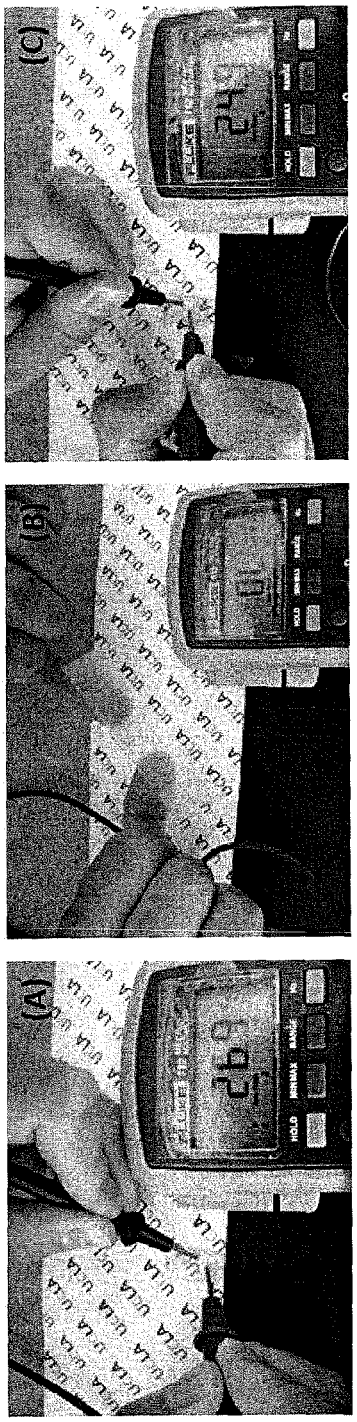
FIGS. 4A-4C show mechanical adhesion tests of the conductive AgNW-$TiO_2$-PEDOT:PSS film. (A) Measuring resistance before scotch tape peeling; (B) Using scotch tape to peel the film; (C) Measuring resistance after scotch tape peeling.

To understand the functions of both $TiO_2$ sol-gel and PEDOT:PSS treatments we compare scanning electron microscope (SEM) and transmission electron microscopy (TEM) images of the films before and after the treatments. FIGS. 3A-3F compare the SEM and TEM images. For the pristine AgNW film, the connection between crossed AgNWs is mainly driven by the gravity of AgNWs and the capillary force from solvent evaporation. From the SEM image (FIG. 3A) of the pristine AgNW film, clear charging can be observed at the crossed positions between AgNWs. This indicates the low conductivity due to the loose connection between AgNWs. In FIG. 3B, the AgNW film is treated with $TiO_2$ sol-gel solution. The solvent evaporation provides the capillary force which will drive $TiO_2$ nanoparticles to assemble and aggregate around AgNWs randomly and discontinuously. It is notable that there are meniscus structures formed around the AgNWs junction positions which bind the crossed AgNWs together. Such meniscus structures are ascribed to the capillary force induced by solvent evaporation. Moreover, the meniscus $TiO_2$ nanoparticle aggregation can be found between the substrate and AgNW and this helps AgNWs to stick onto substrate. However, $TiO_2$ nanoparticle aggregations are usually weak and brittle and cannot provide very strong adhesion and tension. The AgNW film can still be peeled off from the substrate. To further enhance its mechanical properties, the AgNW-$TiO_2$ film is then treated by PEDOT:PSS solution. FIG. 3C shows the SEM image of the AgNW-$TiO_2$-PEDOT:PSS hybrid film. After PEDOT:PSS treatment, PEDOT:PSS will form a thin continuous cover layer on the $TiO_2$-coated AgNWs. All of the $TiO_2$ meniscus structures at the joint points or the positions between AgNWs and substrate are further covered by PEDOT:PSS films, providing much stronger binding force through the whole film. FIGS. 4A-4C show the mechanical adhesion test of the conductive AgNW-$TiO_2$-PEDOT:PSS film. For the as-prepared AgNW-$TiO_2$-PEDOT:PSS film, the resistance measured with the 2-point probe method shows a resistance of ~26.9$\Omega$. After peeling the film with scotch tape 3 times, the resistance is still around ~25$\Omega$. This simple experiment demonstrates the strong mechanical adhesion of the AgNW-$TiO_2$-PEDOT:PSS hybrid film on a glass substrate.

Figure 5:
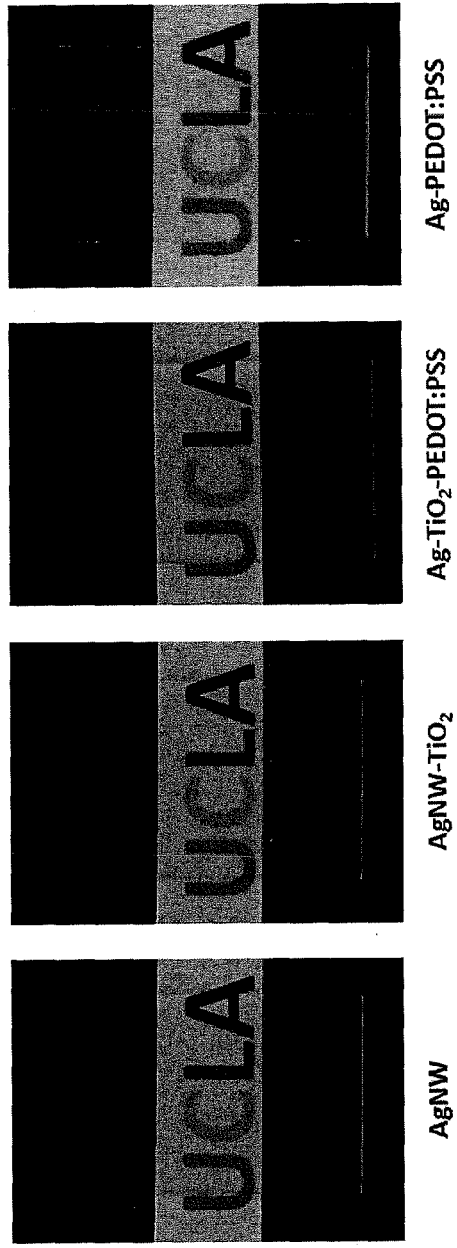
FIG. 5 shows pictures of AgNW films with different treatments. Sample size: 15 mm*25 mm.

In FIG. 5, the appearances of AgNW films with different treatments are compared. The AgNW films were prepared by a spray-coating method. By adjusting the spray-coating parameters, we can produce the AgNW film with excellent uniformity and less agglomeration. After treating the AgNWs with $TiO_2$ or $TiO_2$-PEDOT:PSS solution, the films retain excellent uniformity. However, if only treated with PEDOT:PSS water solution, clear o-rings can be observed on the AgNW+PEDOT:PSS film. The o-rings come from the edges of the PEDPT:PSS water solution drops when they were dripped onto AgNW before spinning. The AgNWs at the edges of PEDOT:PSS drops come off from the substrate due to the surface tension at the edge between water solution and substrate. This implies poor adhesion between AgNWs and the substrate. On the other hand, although the AgNWs after $TiO_2$ treatment can still be peeled off by scotch tape, the binding force provided by $TiO_2$ is strong enough for AgNWs to survive from the following PEDOT:PSS solution coating or other solution processes. From this result, we conclude that the pre-binding by $TiO_2$ treatment is an indispensable step to achieve the robust transparent AgNW hybrid electrode in this example.

Figure 6:
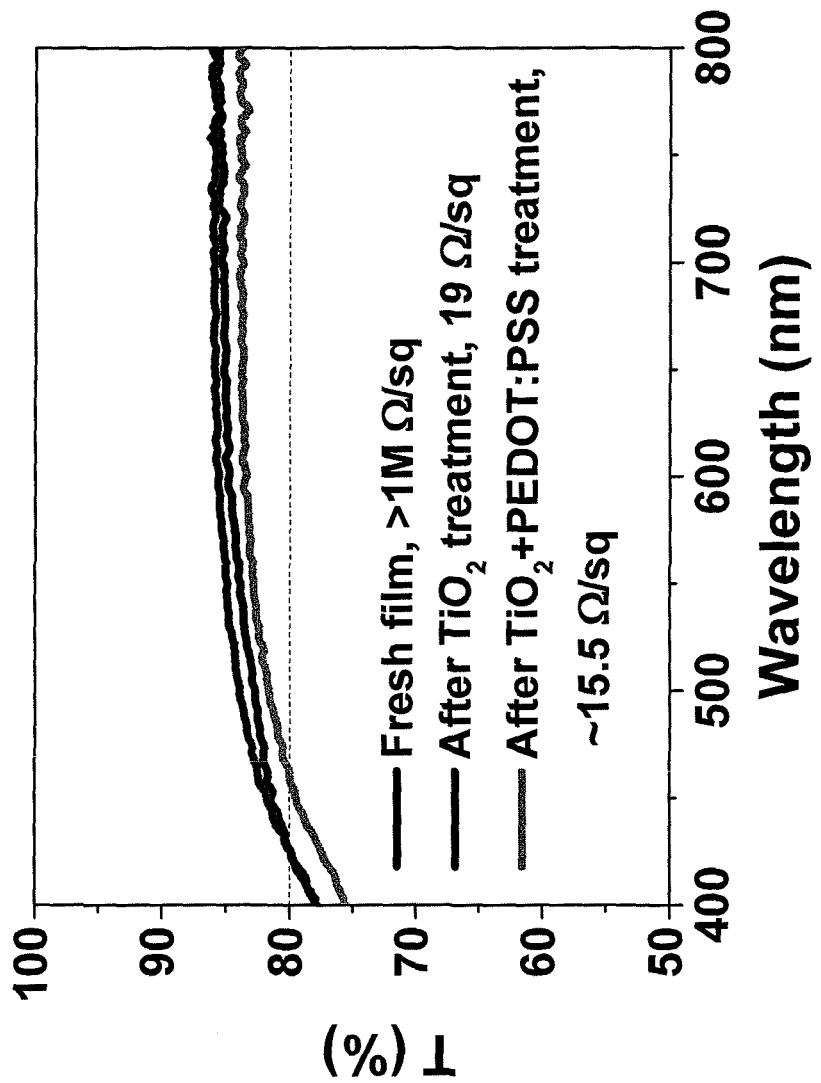
FIG. 6 shows J~V characterization of P3HT:PCBM photovoltaic devices using ITO compared to AgNW-$TiO_2$-PEDOT:PSS substrates.

With the AgNW-$TiO_2$-PEDOT:PSS conductive substrate, we produced an organic photovoltaic device. Poly(3-hexylthiophene) (P3HT) and phenyl-$C_{61}$-butyric acid methyl ester ($PC_{60}BM$) were used as the donor and acceptor, respectively. An ITO substrate was also used for comparison. FIG. 6 shows the current density~voltage characterization. For the device using ITO as the anode electrode, a power conversion efficiency (Eff) of 3.5% was obtained with a short-circuit current density ($J_{sc}$) of 9.3 mA/$cm^2$, an open-circuit voltage ($V_{oc}$) of 0.57 V and fill factor (FF) of 66.5%. When AgNW-$TiO_2$-PEDOT:PSS substrate was used, similar performance was achieved with $V_{oc}$=0.56 V, $J_{sc}$=9.5 mA·$cm^{-2}$, FF=63.4%, and Eff=3.4%. This indicates that the AgNW-$TiO_2$-PEDOT:PSS substrate works well as the substrate and can be a good replacement for ITO in organic photovoltaic devices. It should be noted that the rough surface of AgNWs film is always a challenge for device fabrication on AgNW films. In this example, we coated the modified-PEDOT:PSS on the AgNW-$TiO_2$-PEDOT:PSS substrate to further bury the AgNWs into a thicker PEDOT:PSS film (~200 nm). The details of modified PEDOT:PSS has been reported in our previous work. With this thicker but conductive coating, the short between the AgNW substrate and the back electrode in the devices can be efficiently avoided.

Figure 7:
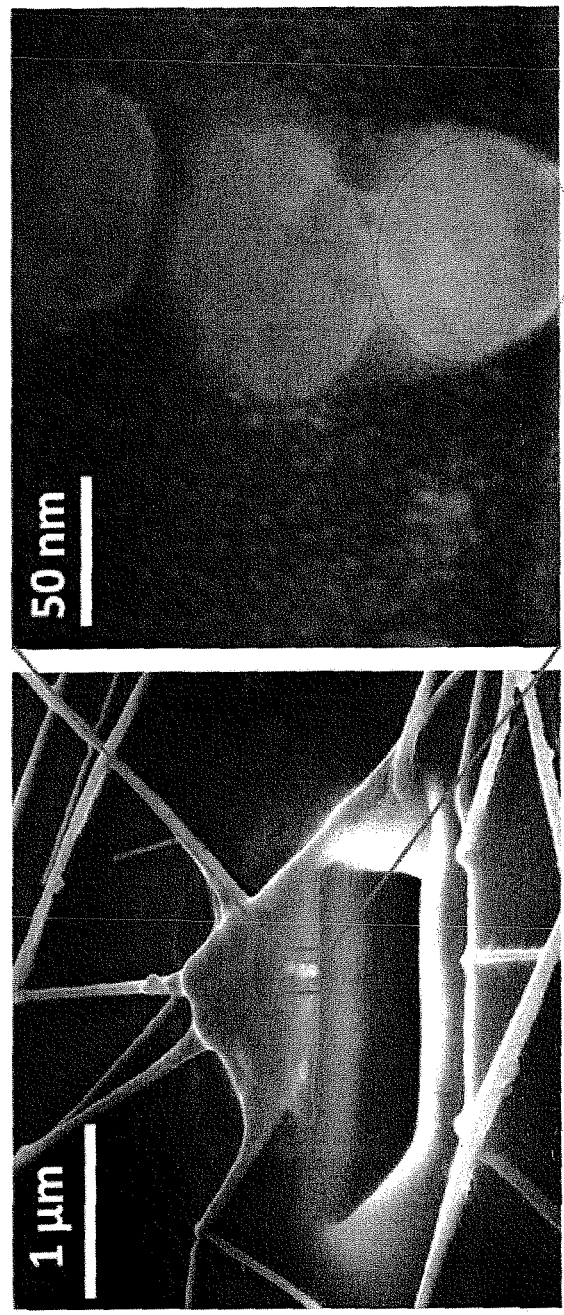
FIG. 7 shows a cross-section SEM image of the AgNW joint point.

Based on the above results, we see that the $TiO_2$ and PEDOT:PSS treatment can help improve AgNW film adhesion and conductivity. The improved adhesion is ascribed to the binding force induced by $TiO_2$ and PEDOT:PSS hybrid composite, which can be clearly observed in the SEM images. However, the reason for the great enhancement in conductivity after treatments is not completely clear. The general concepts of the current invention are not limited to the conceptual explanations and suggestions of particular physical mechanisms. It has been reported that growing Au nanoparticle-coating onto AgNWs will help to improve the film conductivity, because Au nanoparticle conductors will bridge the AgNWs at the crossed positions and provide improved conduction at junction points. In the current case, the $TiO_2$ is a semiconducting material and much less conductive than Au nanoparticles, but $TiO_2$ treatment is found to still improve the film conductivity from MΩ/sq to several tens Ω/sq. The most probable explanation is that the $TiO_2$ solution treatment will help AgNWs to form metallic contacts at the joints. During solvent evaporation of $TiO_2$ sol-gel solution, the capillary force will drive $TiO_2$ sol-gel clusters to assemble around the joints of two crossed AgNWs. When the solution is dried, the volume of $TiO_2$ sol-gel clusters will shrink and provide a much closer package. The driven force coming from the volume shrinkage will push crossed AgNWs closer and result in a metallic contact between each other at the joint point. The meniscus structure formed around the joint point provides evidence for capillary force induced by solvent evaporation. To further understand the contact between AgNWs at the joint point, we used a focused ion beam (FIB) to cut the joint of crossed AgNWs and the cross-section SEM image of the AgNW joint point is shown in FIG. 7. From the enlarged figure, we can observe that the bottom two nanofibers stack closely indicating good metallic contact.

Figure 8:
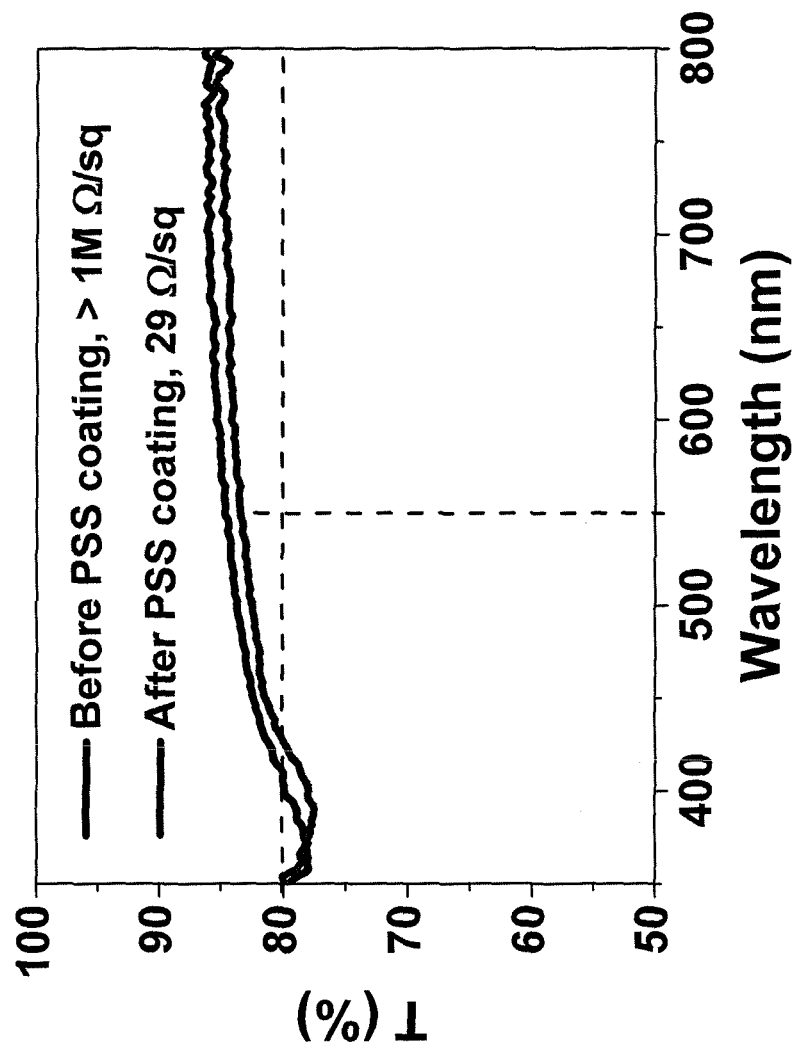
FIG. 8 shows transmission spectra of AgNW film before and after PSS solution treatment. When only treating the film with solvent, but without PSS, no significant resistance decrease is observed.

Beyond the $TiO_2$ sol-gel solution, we found that some insulating materials can also be used to fuse the contact between AgNWs, resulting conductivity enhancement. For example, we have used sodium polystyrene sulfonate (PSS) solution (0.1 wt %, solvent: $H_2O$/IPA=¼) to treat the AgNW film. As we know, PSS is non-conjugated polyelectrolyte and an insulating material in solid state. However, in our example, we find that only PSS treatment also decreases the resistance significantly. FIG. 8 shows the transmission spectra of AgNW films before and after PSS solution treatment. After the treatment, film resistance decreases from MΩ/sq to several tens Ω/sq. This result indicates that the PSS won't isolate the crossed AgNWs, but bind AgNWs together, which is driven by the capillary forces during solvent evaporation. Moreover, because PSS is an insulating material, the conductivity enhancement by PSS treatment also provides indirect evidence for the metallic contact between AgNWs.

In conclusion, we have demonstrated examples of an efficacious method to achieve the highly conductive AgNWs mesh with good transparency and mechanical property according to an embodiment of the current invention. Based on the analogy of ferroconcrete structures, we used $TiO_2$ and PEDOT:PSS to treat the AgNW film and form a AgNW-$TiO_2$-PEDOT:PSS composite film, which has excellent mechanical, electrical, and optical properties. We also found evidence that the solution volume shrinkage and the capillary forces during solvent evaporation are the primary reason for the greatly enhanced conductivity by $TiO_2$ sol-gel solution. Results also indicate that both semiconducting and insulating materials can also be used to improve the performance of AgNW films under optimized conditions according to some embodiments of the current invention. The aforementioned $TiO_2$ nanoparticle, PEDOT:PSS and PSS solutions are just some representative examples. More materials can be used as the conductivity enhancer for AgNW film. These can include, but are not limited to, inorganic nanomaterials ($Fe_3O_4$, ZnO, $Zr_2O_5$, $Co_3O_4$, NiO, $MoO_3$, ITO, Al-doped ZnO, MgO, $Al_2O_3$, et al.), organic, or polymer materials (polyvinylpyrrolidone, polyvinyl acetate, polyvinylphenol, polyvinylpyridine, poly(oxyethylene), polyimide, et al.). In addition to AgNWs, we can also use other nanowire systems, such as, but not limited to, carbon nanotubes, Si nanowires, ZnO nanowires, $TiO_2$ nanowires, $SnO_2$ nanowires, $V_2O_5$ nanowires, etc. The improved connection between nanowires can help to form a continuous network and hence enhance the performance of the nanowire mesh, or network. Moreover, by treating the nanowire network with extra materials, we can integrate additional functions into the nanowire network together with the improved nanowire contact. For example, we can incorporate magnetic properties by incorporating $Fe_3O_4$ nanoparticles into AgNWs networks. If $V_2O_5$, $Co_3O_4$, Pt nanoparticles are filled into the AgNW network voids, or attached onto nanowires, we can include catalytic functions into the conductive network, providing electrocatalytic properties.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method of producing an electro-optic device, comprising:
   providing a substructure;
   depositing a network of nanowires on said substructure;
   depositing a sol-gel solution on said network of nanowires and said substructure; and
   removing solvent from said sol-gel solution to provide fusing material that causes junctions of nanowires within said network of nanowires to fuse together to reduce electrical sheet resistance of said network of nanowires;
   forming a binding layer of a binding material on said network of nanowires and on said fusing material and on said substructure such that said binding material encapsulates said network of nanowires and said fusing material on said substructure; and
   removing solvent from said second sol-gel solution such that said binding material encapsulates said network of nanowires and said fusing material,
   wherein said forming said binding layer of said binding material comprises depositing a second sol-gel solution on said network of nanowires and on said fusing material and on said substructure, and
   wherein said removing solvent from said first sol-gel solution and said removing solvent from said second sol-gel solution both consist essentially of exposing said first and second deposited sol-gel solutions to an environment with a temperature less than about 85° C.

2. A method of producing an electro-optic device according to claim 1, wherein said fusing material comprises clustered nanoparticles.

3. A method of producing an electro-optic device according to claim 2, wherein said sol-gel solution is a titanium dioxide sol-gel solution and said clustered nanoparticles are clustered titanium dioxide nanoparticles.

4. A method of producing an electro-optic device according to claim 1, wherein said fusing material comprises clustered nanoparticles of at least one of $TiO_2$, $Fe_3O_4$, ZnO, $Zr_2O_5$, $Co_3O_4$, NiO, $MoO_3$, ITO, Al-doped ZnO, MgO, and $Al_2O_3$.

5. A method of producing an electro-optic device according to claim 1, wherein said environment has a temperature of about 80° C.

6. A method of producing an electro-optic device according to claim 1, wherein said second sol-gel solution provides an electrically conductive and substantially transparent polymer layer.

7. A method of producing an electro-optic device according to claim 6, wherein said fusing material comprises clustered nanoparticles.

8. A method of producing an electro-optic device according to claim 7, wherein the first-mentioned sol-gel solution is a titanium dioxide sol-gel solution and said clustered nanoparticles are clustered titanium dioxide nanoparticles.

9. A method of producing an electro-optic device according to claim 1, wherein said second sol-gel solution comprises poly(3,4-ethylenedioxythiophene)/poly(styrenesulfonate).

10. A method of producing an electro-optic device according to claim 9, wherein said fusing material comprises clustered nanoparticles.

11. A method of producing an electro-optic device according to claim 10, wherein the first-mentioned sol-gel solution is a titanium dioxide sol-gel solution and said clustered nanoparticles are clustered titanium dioxide nanoparticles.

12. A method of producing an electro-optic device according to claim 11, wherein said network of nanowires consists essentially of Ag nanowires.

13. A method of producing an electro-optic device according to claim 1, wherein said fusing material comprises clustered nanoparticles of at least one of $TiO_2$, $Fe_3O_4$, ZnO, $Zr_2O_5$, $Co_3O_4$, NiO, $MoO_3$, ITO, Al-doped ZnO, MgO, $V_2O_5$, Pt and $Al_2O_3$, and
   wherein said second sol-gel solution comprises at least one of poly(3,4-ethylenedioxythiophene)/poly(styrenesulfonate), polyvinylpyrrolidone, polyvinyl acetate, polyvinylphenol, polyvinylpyridine, poly(oxyethylene) and a polyimide.

14. A method of producing an electro-optic device according to claim 13, wherein said network of nanowires comprises at least one of Ag nanowires, carbon nanotubes, Si nanowires, ZnO nanowires, $TiO_2$ nanowires, $SnO_2$ nanowires, $V_2O_5$ nanowires, Cu nanowires, or Cu alloy nanowires.

15. A method of producing an electro-optic device according to claim 1, wherein said network of nanowires comprises at least one of Ag nanowires, carbon nanotubes, Si nanowires, ZnO nanowires, $TiO_2$ nanowires, $SnO_2$ nanowires, $V_2O_5$ nanowires, Cu nanowires, or Cu alloy nanowires.

16. A method of producing an electro-optic device according to claim 1, wherein said network of nanowires consists essentially of Ag nanowires.

17. A method of producing an electro-optic device according to claim 1, wherein said substructure is a substrate.

18. A method of producing an electro-optic device according to claim 17, wherein said substrate is one of a glass substrate, a plastic substrate, a paper substrate, a semiconductor substrate, or a metal substrate.

19. A method of producing an electro-optic device according to claim 1, wherein said substructure is a remaining portion of said electro-optic device.

20. A method of producing an electro-optic device according to claim 19, wherein said electro-optic device is at least one of a photovoltaic cell, a light emitting diode, a photodiode, or a transistor.

21. A method of producing an electro-optic device according to claim 1, further comprising forming remaining portions of said electro-optic device on said network of nanowires and said fusing material.

22. A method of producing an electro-optic device according to claim 21, wherein said electro-optic device is at least one of a photovoltaic cell, a light emitting diode, a photodiode, a transistor, a display screen or a touch-sensitive display screen.

23. A method of producing an electro-optic device according to claim 1, further comprising forming remaining portions of said electro-optic device on said fusing material.

24. A method of producing an electro-optic device according to claim 23, wherein said electro-optic device is at least one of a photovoltaic cell, a light emitting diode, a photodiode, a transistor, a display screen or a touch-sensitive display screen.

25. An electro-optic device produced according to the method claim 24.

* * * * *